(12) United States Patent
Gurr et al.

(10) Patent No.: US 10,063,165 B2
(45) Date of Patent: Aug. 28, 2018

(54) METHOD AND APPARATUS FOR THE DETECTION OF THE POSITION OF AN OPERATING SWITCH FOR STARTING AN ELECTRIC MOTOR

(71) Applicant: Andreas Stihl AG & Co. KG, Waiblingen (DE)

(72) Inventors: Kay-Steffen Gurr, Heilbronn (DE); Gernot Liebhard, Waiblingen (DE); Jens Kloeker, Erdmannhausen (DE); Jochen Siller, Ludwigsburg (DE); Heinrich Leufen, Schwaikheim (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 0 days.

(21) Appl. No.: 15/488,055

(22) Filed: Apr. 14, 2017

(65) Prior Publication Data

US 2017/0302198 A1    Oct. 19, 2017

(30) Foreign Application Priority Data

Apr. 14, 2016   (DE) .................. 10 2016 004 525

(51) Int. Cl.
*H02P 1/00*     (2006.01)
*F02N 11/04*    (2006.01)
(Continued)

(52) U.S. Cl.
CPC ............ *H02P 1/16* (2013.01); *G01R 31/3277* (2013.01); *G01R 31/34* (2013.01); *H01H 9/54* (2013.01); *H02P 1/02* (2013.01); *H02P 9/08* (2013.01)

(58) Field of Classification Search
None
See application file for complete search history.

(56) References Cited

U.S. PATENT DOCUMENTS

| 6,118,238 | A | * | 9/2000 | Munro | ...................... H02P 9/08 |
| | | | | | 290/46 |
| 2004/0228065 | A1 | | 11/2004 | Hoegener et al. | |
| 2010/0109441 | A1 | | 5/2010 | Gagne | |

FOREIGN PATENT DOCUMENTS

| EP | 2484494 A2 | 8/2012 |
| EP | 2671681 A2 | 12/2013 |
| WO | 2015147331 A1 | 10/2015 |

* cited by examiner

*Primary Examiner* — Bentsu Ro
*Assistant Examiner* — Zemenay Truneh
(74) *Attorney, Agent, or Firm* — Walter Ottesen, P.A.

(57) ABSTRACT

An electric motor is connected to a voltage source via a drive circuit and, between the drive circuit and the voltage source, the operating switch is arranged for the switching of the supply voltage (U) of the voltage source as the input voltage ($U_E$) on the drive circuit. Following the switch-out of the electric motor, the input voltage ($U_E$) on the drive circuit is monitored and a gradient of a rising voltage ramp (dU/dt) of the input voltage ($U_E$) is determined. The gradient of the rising voltage ramp (dU/dt) of the input voltage ($U_E$) thus determined is compared with a predefined limiting value and, in the event of an overshoot of the predefined limiting value, the operating switch is detected as closed, and the electric motor is restarted via the drive circuit.

16 Claims, 4 Drawing Sheets

(51) Int. Cl.
*H02P 1/16* (2006.01)
*G01R 31/327* (2006.01)
*G01R 31/34* (2006.01)
*H01H 9/54* (2006.01)
*H02P 1/02* (2006.01)
*H02P 9/08* (2006.01)

METHOD AND APPARATUS FOR THE DETECTION OF THE POSITION OF AN OPERATING SWITCH FOR STARTING AN ELECTRIC MOTOR

CROSS REFERENCE TO RELATED APPLICATION

This application claims priority of German patent application no. 10 2016 004 525.6, filed Apr. 14, 2016, the entire content of which is incorporated herein by reference.

FIELD OF THE INVENTION

The invention relates to a method and an apparatus for the detection of the position of an operating switch for starting an electric motor.

BACKGROUND OF THE INVENTION

Methods are known for the start-up of the electric motor via a drive circuit. To this end, the electric motor is connected to a voltage source via a drive circuit, wherein the operating switch is arranged between the drive circuit and the voltage source. The operating switch switches the supply voltage on the drive circuit, which then starts up the connected electric motor.

If the operating switch is open, the electric motor runs down. During the run-down of the motor, as a result of the generative motor voltage of the decelerating electric motor, a voltage is still present on the drive circuit. Even once the electric motor is at rest, a voltage will continue to be present on the drive electronics for a further 1-2 seconds, as a result of the existing capacitances of electronic components. Only upon the undershoot of a minimum supply voltage of for example 5 V will the electronics switch over to a state in which they can only resume operation via a reset, immediately a sufficient supply voltage for the electronics is restored.

In order to ensure the trouble-free operation of the electric motor, the electronics in the drive circuit must detect the state of the operating switch. As the voltage present on the drive circuit, resulting from the generative motor voltage during the run-down of the electric motor, is such that the clear detection of a closed operating switch cannot be guaranteed, an additional contact on the operating switch is generally employed for this purpose. Via this additional contact, the drive circuit receives information on the switching state of the operating switch.

For the switch-in of an electric motor via a drive circuit, operating switches with an additional contact for the detection of the switching state of the operating switch are generally required which are structurally complex, and thus cost-intensive. In the event of the failure of the additional contact for the detection of the switching state of the operating switch, the correct operation of the electric motor cannot be guaranteed.

SUMMARY OF THE INVENTION

It is an object of the invention to disclose a simpler, and thus more cost-effective configuration of an operating switch for the start-up of an electric motor, which nevertheless ensures the secure operation of the electric motor via the drive circuit, in any operating state.

The method of the invention is for detecting a switch position of an operating switch for starting an electric motor, wherein the electric motor is connected to a voltage source via a drive circuit, and the operating switch is arranged between the drive circuit and the voltage source, the voltage source being configured to output a supply voltage (U), and the operating switch being configured to switch the supply voltage (U) of the voltage source to the drive circuit as an input voltage ($U_E$). The method includes the steps of: a) monitoring the input voltage ($U_E$) of the drive circuit after a switching off of the electric motor; b) determining a gradient (dU/dt) of a voltage increase of the input voltage ($U_E$); c) comparing the determined gradient (dU/dt) of the voltage increase to a predefined limit value; and, d) recognizing the operating switch as closed when the predefined limit value is exceeded and restarting the electric motor via the drive circuit.

In accordance with a method according to the invention, after the switch-out of the electric motor, the input voltage of the drive circuit is monitored. In principle, this is possible for a limited time interval even after the switch-out of the operating switch, on the grounds that the generative motor voltage and the capacitors and/or coils incorporated in the electronics are such that the drive circuit remains operational for a limited time.

According to an aspect of the invention, following the switch-out of the electric motor and the reclosing of the operating switch, the gradient of a rising voltage ramp of the input voltage present on the drive circuit is determined. This gradient of the rising voltage ramp thus determined is compared with a predefined limiting value. In the event of an overshoot of the predefined limiting value, it can be concluded that the operating switch is closed. If the operating switch is detected as closed, the electric motor is restarted via the drive circuit, such that the rapid and secure restarting of the electric motor is achieved.

According to an aspect of the invention, the gradient of the rising voltage ramp is an indicator for the switching state of the operating switch. An additional switching contact for the detection of the switching state of the operating switch can thus be omitted, thereby simplifying the construction of the operating switch. Any wiring of the additional switching contact to the drive circuit, which would otherwise be required, can likewise be omitted. The gradient of the rising voltage ramp is employed as reliable information regarding the switching state of the operating switch.

The further start-up of the electric motor proceeds in a regular manner after the opening of the operating switch. After the opening of the operating switch, the input voltage on the drive circuit drops out. However, the drive circuit is not de-energized immediately, but remains operational for a limited time interval, notwithstanding the drop-out of the input voltage. After the further actuation of the operating switch (such that the operating switch is closed), the input voltage of the drive circuit rises. If the gradient of the rising voltage ramp exceeds a predefined limiting value, the drive circuit detects the closed state of the operating switch by the gradient thus determined, and the electric motor can be restored to service immediately by the execution of the corresponding control.

If, further to the switch-out of the electric motor and the opening of the operating switch, the input voltage on the drive circuit drops below a predefined limiting value, it is necessary, for the restarting of the electric motor, that restarting will only occur at voltage values of the input voltage which lie above the predefined limiting value. The electric motor will only then be restored to service if a gradient of the rising voltage ramp for the input voltage exceeds a predefined limiting value and the input voltage on the drive circuit exceeds a predefined limiting value.

It has been established as appropriate that the overshoot of the gradient of the rising voltage ramp thus determined in excess of the predefined limiting value and the overshoot of the predefined voltage value should fall within a predefined time window. Only if these two conditions are fulfilled within the time window does the start-up of the electric motor proceed.

The time window appropriately encompasses a time interval of 80 to 200 milliseconds. Advantageously, the rated time window is 100 milliseconds.

If only one of the two aforementioned conditions is fulfilled within the time window, the drive circuit is reset.

It is considered advantageous that the rising voltage ramp of the input voltage should only be determined after the expiry of a time interval following the switch-out of the electric motor. This ensures that a rise in voltage resulting from the electrochemical recovery of the battery cannot cause the restarting of the electric motor. It is appropriately provided that the selected time interval is greater than the recovery time of the battery.

The configuration of the electrical circuit for the execution of a method according to the invention is such that, after the opening of the operating switch, the input voltage on the drive circuit drops below a predefined limiting value within a time interval of 1 to 4 seconds.

The apparatus according to the invention for the detection of the position of an operating switch for the start-up of an electric motor is configured such that the electric motor is connected to a voltage source via the drive circuit. The operating switch is arranged between the drive circuit and the voltage source, and switches the supply voltage of the voltage source to deliver an input voltage to the drive circuit. A monitoring unit is provided, to which the input voltage of the drive circuit is applied. The monitoring unit monitors a gradient of the rising voltage ramp of the input voltage, and compares the gradient thus determined with a predefined limiting value. If the defined limiting value is exceeded, this is an indicator to the effect that the operating switch is closed. Upon the overshoot of the predefined limiting value, the operating switch can thus be detected as closed. Upon the detection of a closed operating switch, the monitoring unit transmits a start-up signal to the drive circuit, in response to which the latter restarts the electric motor.

In order to mask-out the electrochemical regeneration of a battery following the switch-out of the load, it is provided that the monitoring unit should be configured with a timing element, and that the gradient of the rising voltage ramp should only be determined once the timing element has expired.

In addition to the determination and monitoring of the gradient of the rising voltage ramp, the monitoring unit can also incorporate a comparator, which compares the input voltage on the drive circuit with a predefined voltage value. Thus, in addition to the gradient of the rising voltage ramp, an option is provided for the identification of further conditions which must be fulfilled before the restarting of the electric motor can proceed.

The voltage source is appropriately a battery, wherein it can be provided that the battery voltage is greater than the service voltage of the electric motor.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
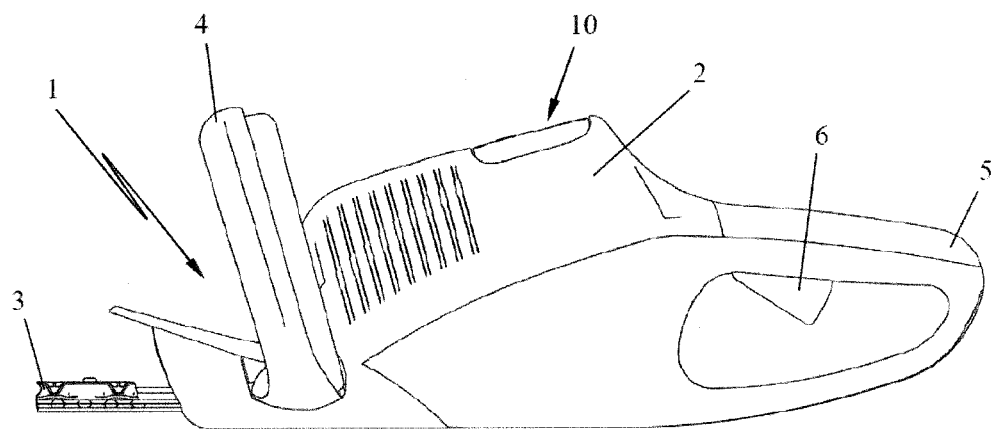
FIG. 1 shows a schematic side view of a portable electrical work apparatus with a battery.

FIG. 1 shows a portable hand-held work apparatus 1 which, in the embodiment, is configured as a hedge trimmer. The work apparatus 1 is an electrical work apparatus, and is powered by a battery 10 which is inserted in the housing 2 of the work apparatus. The work apparatus 1 which is represented has a tool 3, which is driven by an electric motor 50 (FIG. 2).

Figure 2:
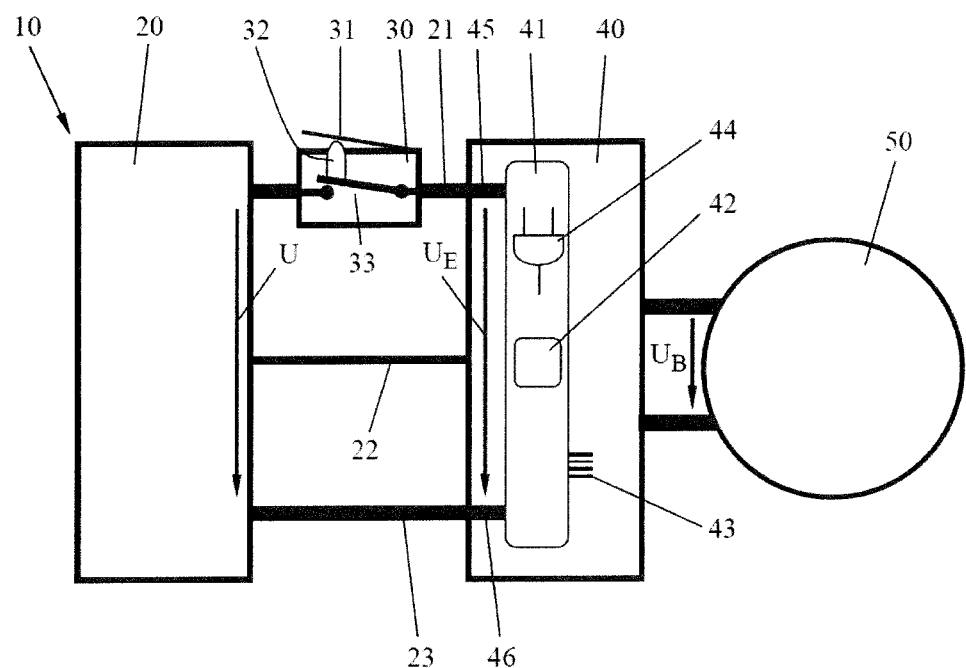
FIG. 2 shows a schematic representation of a circuit layout for the operation of an electric motor.

The work apparatus 1 is configured with a front handle 4 and a rear handle 5 wherein, in the embodiment, the rear handle 5 incorporates an actuating member 6 for an operating switch 30 (FIG. 2).

The work apparatus 1 can also be configured as a battery-operated blower device, a battery-operated brushcutter, a battery-operated hedge trimmer or a similar battery-operated work apparatus.

As shown in FIG. 2, the battery 10 constitutes a voltage source 20 for the work apparatus 1. The voltage source 20 delivers a supply voltage U, which is switched to a drive circuit 40 via the operating switch 30.

In the embodiment represented, the operating switch 30 is configured as a microswitch, and includes a switching lever 31, which engages with an actuating pin 32. The actuating member 6 of the work apparatus 1 cooperates with the switching lever 31. By the depression of the actuating member 6, the switching lever 31 is moved and the contact 33, which is configured as a make contact, is closed.

When the operating switch 30 is closed, the contact 33 is closed, such that the supply voltage U of the voltage source 20 is delivered to the input terminals 45, 46 of the drive circuit 40 via the connecting lines 21, 23 in the form of an input voltage $U_E$. For the communication of the battery 20 with the drive circuit 40, the former is additionally connected to the drive circuit 40 via at least one data line 22. In the embodiment represented, the operating switch 30 is arranged in the connecting line 21, which preferably constitutes the positive pole of the voltage source 20.

For the monitoring of the characteristic of the input voltage $U_E$, a monitoring unit 41 is provided, to which the input voltage $U_E$ is routed. The monitoring unit 41 monitors a gradient $dU/dt$ of the rising voltage ramp 15 of the input voltage $U_E$, as represented for example in FIG. 4. The gradient $dU/dt$ of the rising voltage ramp 15 of the input voltage $U_E$ thus determined is compared with a predefined limiting value. If the gradient $dU/dt$ thus determined exceeds the predefined limiting value, the operating switch 30 or the contact 33 of the operating switch 30 is detected as closed, and this state is referred to the drive circuit 40 via a control line 43, such that the former initiates the start-up of the electric motor 50.

Figure 5:
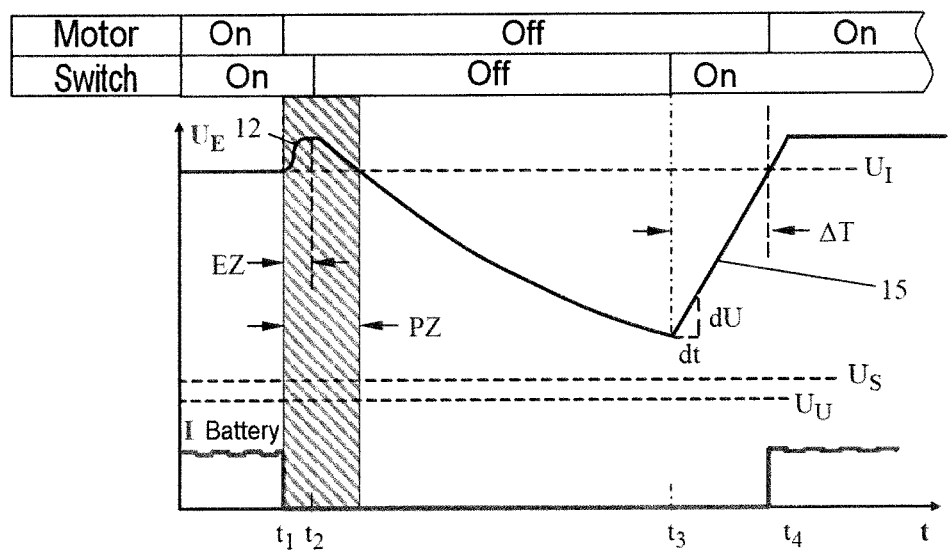
FIG. 5 shows a schematic representation of the voltage characteristic according to FIG. 4, following the switch-out of the energized electric motor; and, FIG. 6 shows a schematic representation of the voltage characteristic of the input voltage, upon the occurrence of an undervoltage.

In the embodiment according to FIG. 2, the monitoring unit 41 is configured as part of the drive circuit 40. Advantageously, the monitoring unit 41 includes a timing element 42 which, for example, dictates a time interval PZ. Only upon the expiry of the time interval PZ is the gradient dU/dt of the rising voltage ramp 15 of the input voltage $U_E$ evaluated, as shown in FIG. 5. This is specifically appropriate in the event of the switch-out of the electric motor 50 on the grounds of a fault or an overload.

The monitoring unit 41 can additionally be provided with a comparator 44, which compares the input voltage $U_E$, present on the input terminals 45, 46 with a predefined voltage value $U_I$, $U_S$ and/or $U_U$, as described hereinafter in greater detail.

In the embodiment according to FIG. 2, the supply voltage U is greater than the service voltage $U_B$ delivered to the electric motor 50 via the drive circuit 40. The drive circuit 40 varies the service voltage $U_B$ of the electric motor 50, and adjusts the voltage to permissible variables, for example via pulse width modulation.

The function of the circuit arrangement according to an aspect of the invention, as shown in FIG. 2, is the detection of the position of the operating switch 30 for the start-up of the electric motor 50. The electric motor 50 is connected to the voltage source 20 via the drive circuit 40, wherein the supply voltage U of the voltage source is delivered as the input voltage $U_E$ of the drive circuit 40.

Figure 4:
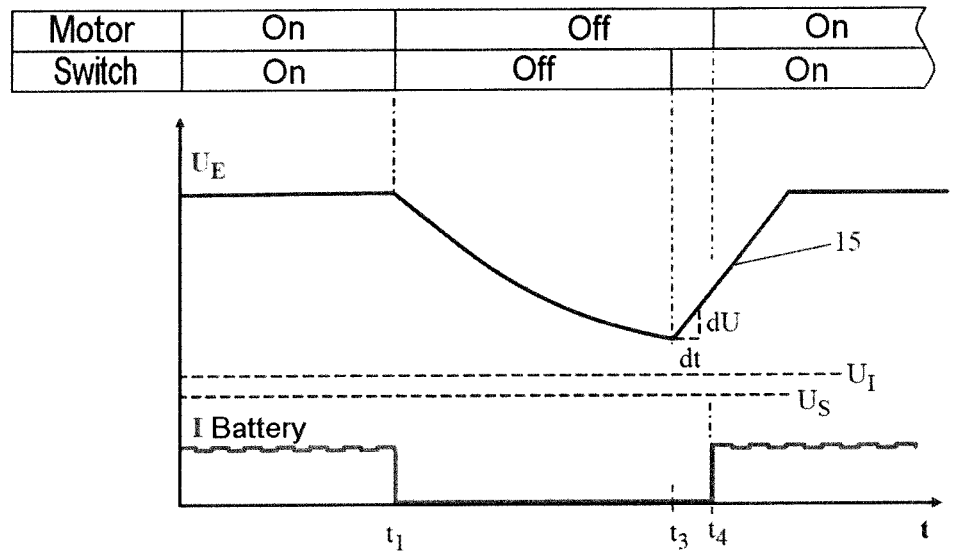
FIG. 4 shows a schematic representation of the voltage characteristic of an input voltage on a drive circuit for the electric motor.

If—as represented in FIG. 4—the input voltage $U_E$ exceeds an initial voltage $U_I$, a closed state of the operating switch 30 is detected, if the gradient dU/dt of a rising voltage ramp 15 of the input voltage $U_E$ exceeds a predefined limiting value. To this end, following the switch-out of the electric motor 50, the switching positions of which are represented at the top of FIG. 4, the input voltage $U_E$ on the drive circuit 40 is monitored. In FIG. 4, the state of the operating switch 30 is indicated in a box above the diagram.

If the user opens the operating switch 30 at a time point $t_1$, as the supply voltage U is isolated from the input terminals 45/46, the input voltage $U_E$ drops. In FIG. 4 it is assumed that the input voltage $U_E$ does not drop below a starting voltage $U_S$ or an initial voltage $U_I$. If the operator recloses the operating switch 30 by depressing the actuating member 6 at a time point $t_3$, the input voltage $U_E$ rises. Immediately a gradient dU/dt of the rising voltage ramp 15 is detected which exceeds a predefined limiting value, the electric motor 50 is switched-in at time point $t_4$. By means of the gradient dU/dt, the operating switch 30 or the contact 33 thereof was detected as closed, and the electric motor 50 is correctly restarted, thus permitting the more rapid restoration to service of the electric motor 50.

Monitoring of the gradient dU/dt of the rising voltage ramp 15 can proceed directly upon the switch-out of the operating switch 30, and can thus start immediately. A negative gradient dU/dt of the falling voltage ramp is ignored. Only a positive gradient dU/dt of the rising voltage ramp 15 is compared with the predefined limiting value. Only if a positive gradient dU/dt is established does this constitute an indicator for the switching state of the operating switch.

In the embodiment according to FIG. 5, a switch-out of the energized electric motor 50 is represented. For example, the electric motor 50 can be switched-out via a protective circuit in the event of an excessive current take-up associated with the jamming of the tool 3 of the work apparatus 1.

As indicated at time point $t_1$, further to the switch-out of the electric motor 50 by the protective circuit, electrochemical recovery of the battery 10 occurs, thus resulting in a rise in voltage 12. Only upon the switch-out of the operating switch 30 at time point $t_2$ does the input voltage $U_E$ fall in accordance with the characteristic curve represented. In order to ensure that a positive gradient dU/dt of the rise in voltage 12 does not result in the erroneous detection of the switching state of the operating switch 30 it is provided that, further to the switch-out of the electric motor 50 by the protective circuit, the gradient dU/dt of a rising voltage ramp 15 is not evaluated or determined within a time interval PZ. This time interval PZ is selected such that it is greater than the recovery time EZ of the battery 10. The start of detection of a gradient dU/dt of the rising voltage ramp 15 ensues further to the expiry of the time interval PZ and the overshoot of the starting voltage Us, as fulfilled by the example shown in FIG. 5.

If, further to the opening of the operating switch 30, the operating switch is actuated once more at time point $t_3$, a rising voltage ramp 15 occurs with effect from this time point $t_3$. If it is established that the gradient dU/dt of the rising voltage ramp 15 determined further to the switch-in of the operating switch 30 exceeds the predefined limiting value, a closed state of the operating switch is detected, and a first condition for the restarting of the electric motor 50 is fulfilled. The fulfillment of this first condition for the switch-in of the electric motor 50 (detection of the closed state of the operating switch 30 by the overshoot of the predefined limiting value for the rising voltage ramp dU/dt) is held in a buffer memory for a specified time interval Δt. The further condition for the restarting of the electric motor 50 represented in FIG. 5 is an overshoot of the initial voltage $U_I$. Only upon the detection by the monitoring unit 41, via the comparator 44, of an overshoot of a predefined initial voltage value $U_I$ does the start-up of the electric motor 50 proceed. It is thus provided that the overshoot of the gradient dU/dt of the rising voltage ramp 15 in excess of the predefined limiting value and the overshoot of the predefined initial voltage $U_I$ lie within a predefined time interval ΔT. A time interval ΔT of 80 to 200 milliseconds has proven to be appropriate. Advantageously, the time interval ΔT is 100 milliseconds.

If, further to the expiry of the time interval ΔT, at least one of the two conditions (overshoot of the limiting value of the gradient dU/dt of the rising voltage ramp 15 and/or the overshoot of the predefined initial value $U_I$) is not established, no restarting of the electric motor 50 will proceed.

Figure 6:
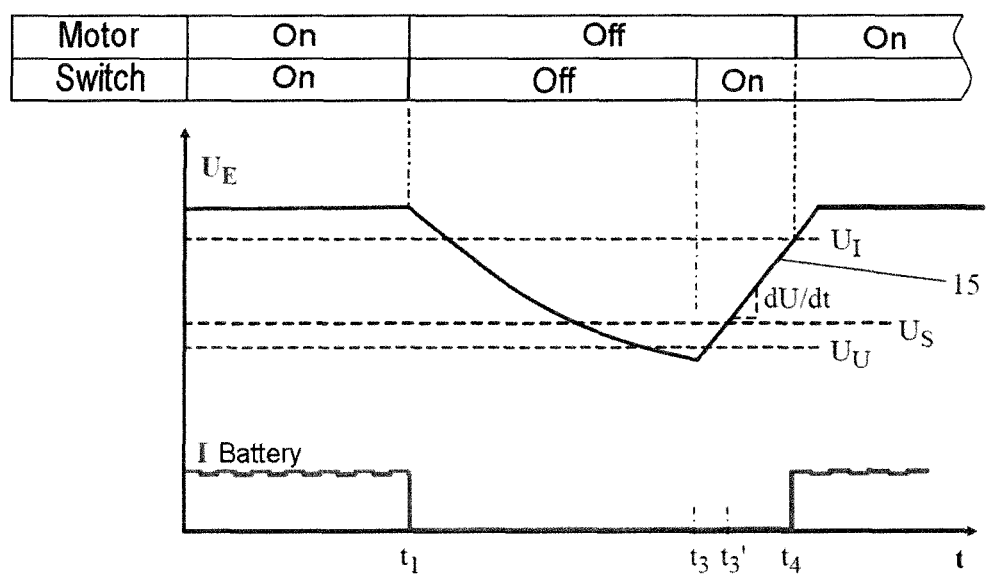

FIG. 6 illustrates the run-down of the electric motor 50 following the switch-out of the operating switch 30. In FIG. 6 it is assumed that the input voltage $U_E$, following the opening of the operating switch 30 at time point $t_1$, drops below an undervoltage $U_U$. If the user then recloses the operating switch 30 at time point $t_3$, the input voltage $U_E$ rises again, until firstly the undervoltage $U_U$ is exceeded, and thereafter a starting voltage $U_S$ for the restarting of the electric motor 50 is exceeded. Appropriately, the monitoring of the input voltage $U_E$ on the drive circuit 40 in relation to the gradient dU/dt of the rising voltage ramp 15 only proceeds after this time point $t'_3$. In accordance with the representation of the voltage characteristic in FIG. 5, following the overshoot of the starting voltage $U_S$ a gradient dU/dt of the rising voltage ramp 15 must firstly be determined which exceeds a predefined limiting value. The condition must additionally be fulfilled that the initial voltage $U_I$ is exceeded prior to the restarting of the electric motor 50 at time point $t_4$. The gradient dU/dt of the rising voltage ramp 15 is to be determined with effect from the start of the overshoot of the starting voltage $U_S$ up to the overshoot of the initial voltage $U_I$. Immediately the rise in the gradient dU/dt in excess of a predefined limiting value is detected, this item of data will be stored. If, during this time interval from $t_3$ to $t_4$, no gradient dU/dt of the rising voltage ramp 15 is detected which exceeds the predefined limiting value, the electric motor 50 will not be started.

Figure 3:
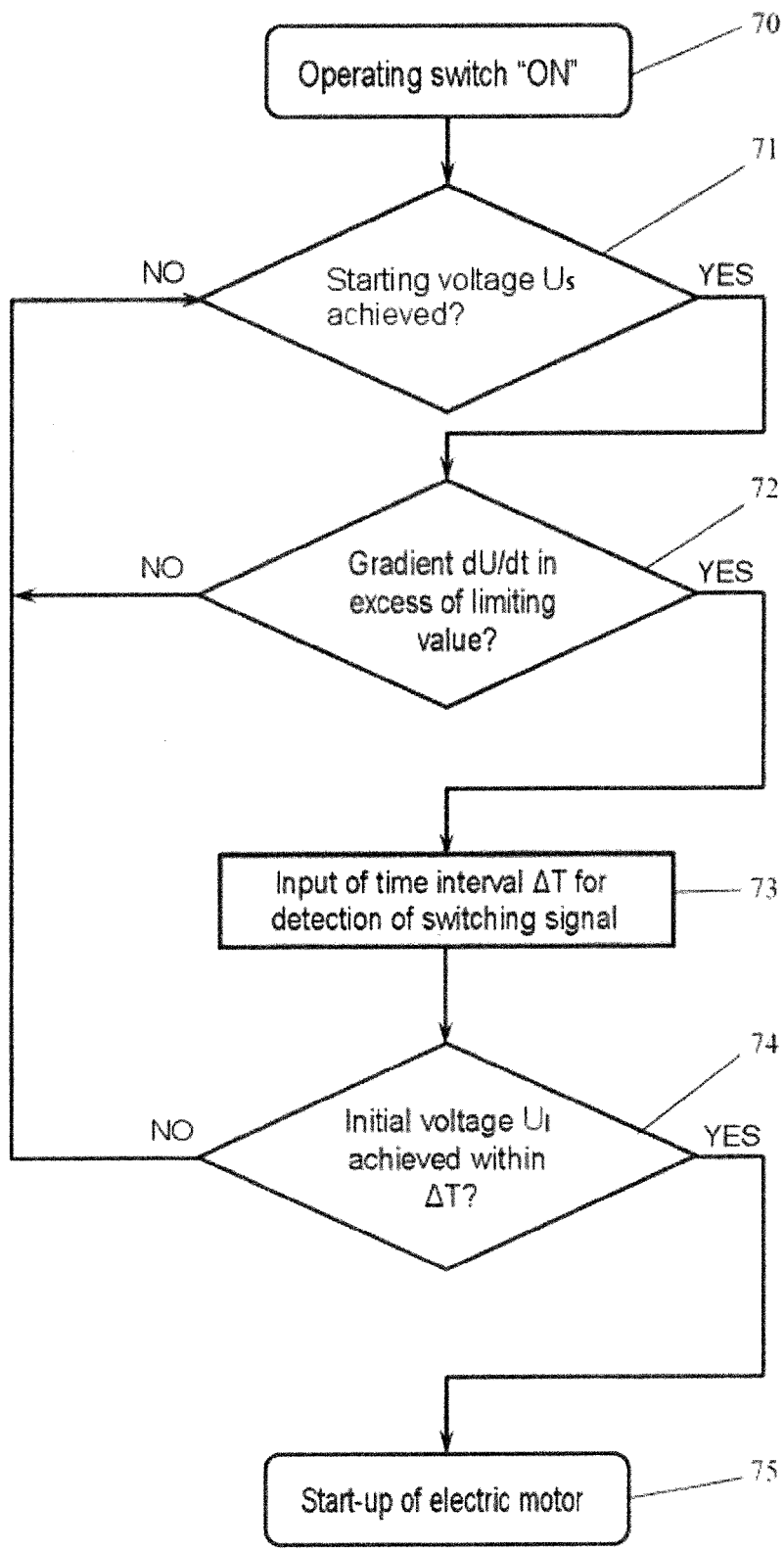
FIG. 3 shows a flow chart for the start-up of the electric motor.

FIG. 3 represents the sequence of an embodiment of a method according to the invention. Field 70 indicates that the operating switch 30—following a switch-out—has been reclosed (ON). In a first field 71, it is queried whether the input voltage $U_E$ has achieved the starting voltage $U_S$ required for the restarting of the electric motor 50. This is represented correspondingly in FIG. 6.

If this is the case, the input voltage $U_E$ will lie above a predefined starting voltage $U_S$, the gradient dU/dt of the rising voltage ramp 15 of the input voltage $U_E$ will be determined, and it will be confirmed whether this variable exceeds a predefined limiting value (field 72). If this is the case, in field 73, the input of a predefined time interval ΔT will proceed, within which the detection of the switching signal for the switch-in of the electric motor 50 must lie.

Thereafter, in field 74, it is queried whether the initial voltage $U_I$ has been achieved within the time window ΔT. If this is the case, in field 75, the electric motor 50 is started. If the conditions specified in fields 72 and 74 are not fulfilled, the sequence branches back to field 71, via the "NO" branch. If, for example, following the detection of the gradient dU/dt, the initial voltage $U_I$ is not achieved within the time window ΔT, the sequence branches back to the start of field 71 via the "NO" path.

It is understood that the foregoing description is that of the preferred embodiments of the invention and that various changes and modifications may be made thereto without departing from the spirit and scope of the invention as defined in the appended claims.

What is claimed is:

1. A method for detecting a switch position of an operating switch for starting an electric motor, wherein the electric motor is connected to a voltage source via a drive circuit, and the operating switch is arranged between the drive circuit and the voltage source, the voltage source being configured to output a supply voltage (U), the operating switch being configured to switch the supply voltage (U) of the voltage source to the drive circuit as an input voltage ($U_E$), the method comprising the steps of:
   a) monitoring the input voltage ($U_E$) of the drive circuit after a switching off of the electric motor;
   b) determining a gradient (dU/dt) of a voltage increase of the input voltage ($U_E$);
   c) comparing the determined gradient (dU/dt) of the voltage increase to a predefined limit value; and,
   d) recognizing the operating switch as closed when the predefined limit value is exceeded and restarting the electric motor via the drive circuit.

2. The method of claim 1, wherein the restarting of the electric motor occurs after an opening of the operating switch.

3. The method of claim 1, wherein the electric motor is started via the drive circuit only after a predefined voltage value ($U_1$) has been exceeded.

4. The method of claim 3, wherein the exceeding of the predefined limit value by the determined gradient (dU/dt) of the voltage increase and the exceeding of the predefined voltage value ($U_1$) lie in a predefined time window (Δt).

5. The method of claim 4, wherein the time window (Δt) extends over a time period of 80 to 200 milliseconds.

6. The method of claim 4, wherein the time window (Δt) extends over a time period of 100 milliseconds.

7. The method of claim 5 further comprising the step of resetting the drive circuit after the time window (Δt) has closed.

8. The method of claim 1, wherein the voltage increase of the input voltage ($U_E$) is determined only after a pause time (PZ) has elapsed after a switching off of the electric motor.

9. The method of claim 8, wherein the voltage source is a battery and the pause time (PZ) is selected to be greater than a recovery time (EZ) of the battery.

10. The method of claim 1, wherein, after the opening of the operating switch, the input voltage ($U_E$) of the drive circuit decreases to below a predefined limit value ($U_S$) over a time period of 1 to 4 seconds.

11. The method of claim 10, wherein the input voltage ($U_E$) decreases to zero over the time period of 1 to 4 seconds.

12. An apparatus for detecting a switching position of an operating switch for starting an electric motor, the electric motor being connected to a voltage source configured to output a supply voltage (U) via a drive circuit, the operating switch being arranged between the drive circuit and the voltage source, the operating switch being configured to switch the supply voltage onto the drive circuit as an input voltage ($U_E$), the apparatus comprising:
   a monitoring unit configured to have the input voltage ($U_E$) applied thereto;
   said monitoring unit being configured to monitor a gradient (dU/dt) of a voltage increase of the input voltage ($U_E$);
   said monitoring unit being further configured to compare said gradient (dU/dt) of said voltage increase to a predefined limit value; and,
   said monitoring unit being further configured to recognize the operating switch as being closed when said predefined limit value is exceeded and to transmit a start signal to the drive circuit via at least one control line so as to restart the electric motor via the drive circuit.

13. The apparatus of claim 12, wherein said monitoring unit includes a timing element and said monitoring unit is configured to detect said gradient (dU/dt) of a voltage increase of the input voltage ($U_E$) only after said timing element has elapsed.

14. The apparatus of claim 12, wherein said monitoring unit includes a comparator configured to compare said input voltage ($U_E$) to a predefined voltage value ($U_1$, $U_S$, $U_U$).

15. The apparatus of claim 12, wherein the voltage source is a battery.

16. The apparatus of claim 15, wherein:
   the battery has a battery voltage (U);
   the electric motor has an operating voltage ($U_B$); and,
   the battery voltage (U) is greater than the operating voltage ($U_B$) of the electric motor.

* * * * *